(12) United States Patent
Lee (10) Patent No.: US 7,384,845 B2
(45) Date of Patent: Jun. 10, 2008

(54) METHODS OF FABRICATING FLASH MEMORY DEVICES INCLUDING WORD LINES WITH PARALLEL SIDEWALLS

(75) Inventor: Wook-Hyoung Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 281 days.

(21) Appl. No.: 10/913,979

(22) Filed: Aug. 6, 2004

(65) Prior Publication Data

US 2005/0037572 A1 Feb. 17, 2005

(30) Foreign Application Priority Data

Aug. 13, 2003 (KR) ...................... 10-2003-0056260

(51) Int. Cl.
*H01L 21/336* (2006.01)
(52) U.S. Cl. ...................................... 438/258; 438/286
(58) Field of Classification Search ................ 438/258, 438/286
See application file for complete search history.

(56) References Cited

U.S. PATENT DOCUMENTS

| | | | | | |
|---|---|---|---|---|---|
| 5,400,276 | A | * | 3/1995 | Takeguchi | ............ 365/185.12 |
| 5,510,288 | A | * | 4/1996 | Hong | ......................... 438/278 |
| 5,631,179 | A | * | 5/1997 | Sung et al. | ................. 438/264 |
| 5,936,889 | A | * | 8/1999 | Choi | ..................... 365/185.22 |
| 5,943,262 | A | * | 8/1999 | Choi | ..................... 365/185.17 |
| 6,038,170 | A | * | 3/2000 | Shiba | ..................... 365/185.13 |
| 6,040,217 | A | * | 3/2000 | Lin et al. | ..................... 438/258 |
| 6,067,250 | A | | 5/2000 | Ravazzi et al. | |
| 6,160,297 | A | * | 12/2000 | Shimizu et al. | ............. 257/390 |
| 6,376,876 | B1 | * | 4/2002 | Shin et al. | ................... 257/315 |
| 6,380,032 | B1 | * | 4/2002 | Lee et al. | ................... 438/257 |
| 6,384,449 | B2 | * | 5/2002 | Lee et al. | ................... 257/315 |
| 6,385,085 | B2 | * | 5/2002 | Sato et al. | ............. 365/185.03 |
| 6,410,443 | B1 | * | 6/2002 | Avanzino et al. | |
| 6,441,427 | B1 | * | 8/2002 | Yamada et al. | |
| 6,515,329 | B2 | * | 2/2003 | Lee et al. | ..................... 257/315 |
| 6,570,810 | B2 | * | 5/2003 | Wong | ..................... 365/230.03 |
| 6,618,292 | B2 | * | 9/2003 | Sakui | |
| 6,621,119 | B1 | * | 9/2003 | Wu | .............................. 257/321 |

(Continued)

FOREIGN PATENT DOCUMENTS

JP 11-031800 2/1999

(Continued)

*Primary Examiner*—Steven Loke
*Assistant Examiner*—David Goodwin
(74) *Attorney, Agent, or Firm*—Myers, Bigel, Sibley & Sajovec, P.A.

(57) ABSTRACT

Methods of fabricating integrated circuit devices are provided. The method includes forming a buried diffusion layer in a source active region. A word line pattern is formed crossing over parallel cell active regions and the source active region. The word line pattern has parallel sidewalls such that the word line pattern forms a substantially straight line pattern on an integrated circuit substrate. A plurality of bit line contact plugs and at least one common source contact plug are formed in an insulating layer on the integrated circuit substrate. The bit line contact plugs and the common source contact plug are electrically coupled to the buried diffusion layer and disposed in a line on the integrated circuit substrate that is substantially parallel to the word line pattern. Related integrated circuit devices are also provided.

12 Claims, 8 Drawing Sheets

U.S. PATENT DOCUMENTS

| | | | |
|---|---|---|---|
| 6,689,658 B2* | 2/2004 | Wu | 438/257 |
| 6,723,604 B2* | 4/2004 | Yuan et al. | 438/257 |
| 6,770,533 B2* | 8/2004 | Hisamune et al. | 438/258 |
| 6,781,186 B1* | 8/2004 | Wu | 257/315 |
| 6,801,456 B1* | 10/2004 | Hsu et al. | 365/185.18 |
| 6,819,592 B2* | 11/2004 | Noguchi et al. | 365/185.17 |
| 6,828,637 B2* | 12/2004 | Kim et al. | |
| 6,894,339 B2* | 5/2005 | Fan et al. | 257/314 |
| 6,903,406 B2* | 6/2005 | Lee et al. | 257/315 |
| 6,925,008 B2* | 8/2005 | Ichige et al. | 365/185.17 |
| 7,005,696 B2* | 2/2006 | Yih et al. | 257/314 |
| 7,029,975 B1* | 4/2006 | Fang et al. | 438/258 |
| 2002/0064916 A1* | 5/2002 | Nagai et al. | 438/257 |
| 2003/0099144 A1* | 5/2003 | Kim et al. | |
| 2003/0141541 A1* | 7/2003 | Wu | 257/319 |
| 2003/0143790 A1* | 7/2003 | Wu | |
| 2003/0232472 A1* | 12/2003 | Wu | |
| 2005/0037572 A1* | 2/2005 | Lee | 438/257 |
| 2005/0269623 A1* | 12/2005 | Haraguchi et al. | |
| 2006/0034117 A1* | 2/2006 | Jeong et al. | |
| 2006/0051977 A1* | 3/2006 | Adachi et al. | |
| 2006/0079052 A1* | 4/2006 | Kanamori | 438/257 |
| 2006/0131637 A1* | 6/2006 | Kakoschke et al. | |

FOREIGN PATENT DOCUMENTS

| | | |
|---|---|---|
| KR | 1999-0075947 | 10/1999 |
| KR | 2001-0027677 | 4/2001 |

* cited by examiner

METHODS OF FABRICATING FLASH MEMORY DEVICES INCLUDING WORD LINES WITH PARALLEL SIDEWALLS

CLAIM OF PRIORITY

This application is related to and claims priority from Korean Patent Application No. 2003-56260, filed on Aug. 13, 2003, the disclosure of which is hereby incorporated herein by reference as if set forth in its entirety.

FIELD OF THE INVENTION

The present invention relates to integrated circuit devices and related methods and, more particularly, to integrated circuit memory devices and related methods.

BACKGROUND OF THE INVENTION

Integrated circuit memory devices used for storing data can typically be categorized as either volatile memory devices or nonvolatile memory devices. Volatile memory devices generally lose any stored data when power supplied to the volatile memory device is interrupted. Nonvolatile memory devices typically retain any stored data even when power supplied to the nonvolatile memory device is interrupted. Accordingly, nonvolatile memory devices, such as flash memory devices have been widely used in, for example, memory cards, mobile telecommunication systems and the like, for their memory retention capabilities.

Figure 1:
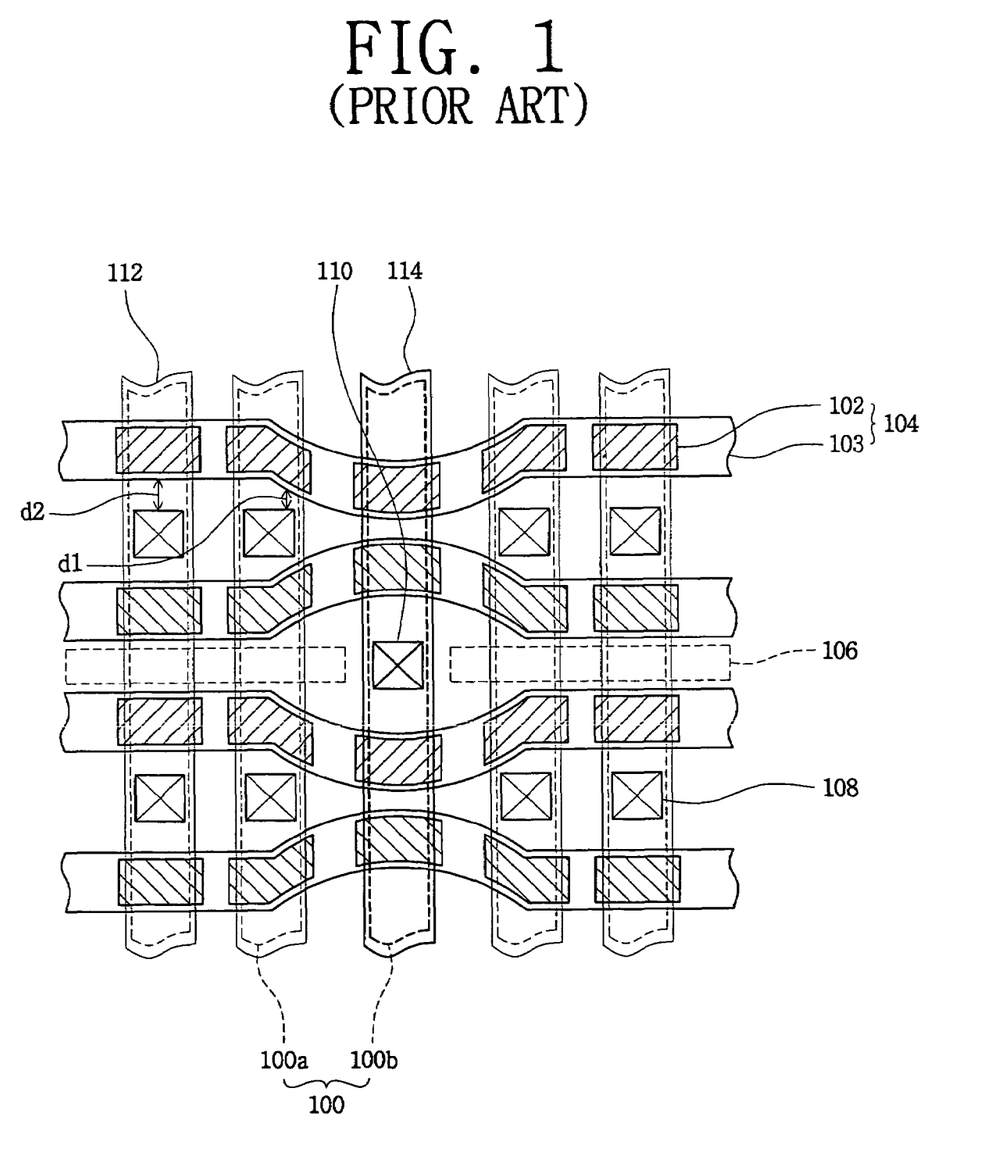
FIG. 1 is a plan view illustrating conventional NOR-type flash memory devices.

Information stored in a flash memory device may be electrically deleted or programmed. Generally, there are two types of flash memory devices, a NOR-type flash memory device and a NAND-type flash memory device. FIG. 1 illustrates a plan view of a conventional NOR-type flash memory device. Referring to FIG. 1, a device isolation layer (not shown) is provided on an integrated circuit substrate to define a plurality of active regions 100, for example, cell active regions 100a and source active region 100b. A plurality of word line patterns 104 is provided on the integrated circuit substrate and cross the active regions 100. Each of the word line patterns 104 includes a floating gate pattern 102, an inter-gate dielectric layer (not shown) and a control gate 103, which are sequentially stacked. Drain regions are provided in the cell active regions 100a along one sidewalls of the word line patterns 104 and bit line contact holes 108 are provided in the drain regions. A common source line 106, which is typically self-aligned to the word line patterns 104, is provided along the other sidewall of the word line patterns 104, and a common source contact hole 110 is provided in a region between the common source line 106 and the source active region 100b. A conductive material is provided in the bit line contact holes 108 to provide bit line contact plugs. Upper surfaces of the bit line contact plugs are electrically coupled to bit lines 112. The bit lines 112 are provided on the active cell regions 100a crossing the word line patterns 104. A conductive material is also provided in the common source contact hole 110 to provide a common source contact plug. An upper surface of the common source contact plug is electrically coupled to a common source contact wiring 114. The common source contact wiring 114 is provided on the source active region 100b parallel with the bit lines 112.

As illustrated in FIG. 1, a source contact hole is not formed for each unit cell of the flash memory device, a common source line 106 is formed instead. Accordingly, the width of the common source line 106 may be reduced, which may allow the size of the integrated circuit device to be reduced. However, in order to form the common source contact hole 110 such that it contacts the common source line 106 having the reduced width, the word line patterns 104 may be curved around the common source contact hole 110 as illustrated in FIG. 1.

As illustrated, the word line patterns 104 are curved at both sides of the common source contact hole 110. Thus, a distance d1 between the control gates 103 crossing over the active cell regions 100a adjacent to the common source contact hole 110 and the bit line contact holes 108 adjacent to the control gates 103, is smaller than a distance d2 between the control gates 103 on other active cell regions 100a and the bit line contact holes 108 adjacent to the control gates 103. Accordingly, coupling ratios between cells on the cell active regions 100a at both sides of the source active region 100b and cells on other cell active regions 100a may be different and may increase distribution of an erase threshold voltage of the NOR-type flash memory device.

Furthermore, the distance between floating gates 102 adjacent to both sides of the bit line contact holes 108 on the cell active regions 100a at both sides of the source active region 100b may be reduced and may reduce an alignment margin when the bit line contact holes are formed. Thus, if significant contact misalignment occurs, the bit line contact plug and the word line patterns 104 adjacent to both sides of the bit line contact plug may be electrically shorted, which may adversely affect the characteristics of the NOR-type flash memory device.

SUMMARY OF THE INVENTION

Some embodiments of the present invention provide methods of forming integrated circuit devices. The method includes forming a buried difflusion layer in a source active region. A word line pattern is formed crossing over parallel cell active regions and the source active region. The word line pattern has parallel sidewalls such that the word line pattern forms a substantially straight line pattern on an integrated circuit substrate. A plurality of bit line contact plugs and at least one common source contact plug are formed in an insulating layer on the integrated circuit substrate. The bit line contact plugs and the common source contact plug are electrically coupled to the buried diffusion layer and disposed in a line on the integrated circuit substrate that is substantially parallel to the word line pattern. Related integrated circuit devices are also provided.

In further embodiments of the present invention, a common source line and drains may be formed in the integrated circuit substrate adjacent to a first sidewall of the word line pattern and in the cell active regions adjacent to a second sidewall of the word line pattern, respectively. The drains may be electrically coupled to the bit line contact plugs and the common source line may be electrically coupled to the common source contact plug through the buried difflusion layer. In certain embodiments of the present invention, the buried diffusion layer, the common source line and the drains may include impurity diffusion regions having a same type of impurity ions.

In still further embodiments of the present invention, a distance between the plurality of the bit line contact plugs and the word line pattern may be substantially the same. A plurality of floating gate patterns may be formed on the plurality of cell active regions and the source active region may be free of the floating gate patterns. The plurality of floating gate patterns may be formed by forming a first conductive layer on the integrated circuit substrate and patterning the first conductive layer to provide the plurality of floating gate patterns.

In some embodiments of the present invention, a device isolation layer may be formed in the integrated circuit substrate. The device isolation layer may define the plurality of parallel cell active regions and the source active region. Impurity ions may be implanted into the integrated circuit substrate using the device isolation layer and the floating gate patterns as ion implantation masks. The impurity ions may include N-type impurity ions.

In further embodiments of the present invention, the an inter-gate dielectric layer on the integrated circuit substrate after forming the buried diffusion layer and a second conductive layer may be formed on the inter-gate dielectric layer. A third conductive layer may be formed on the second conductive layer and a capping layer may be formed on the third conductive layer. The capping layer, the third conductive layer, the second conductive layer, the inter-gate dielectric layer and the floating gate patterns may be patterned to provide the word line pattern.

In some embodiments of the present invention, a common source contact wiring may be formed that is electrically coupled to upper surfaces of the common source contact plug. In certain embodiments of the present invention, the integrated circuit device may be a flash memory device.

While the present invention is described above primarily with reference to methods of fabricating integrated circuit devices, integrated circuit devices are also provided herein.

BRIEF DESCRIPTION OF THE DRAWINGS

FIGS. 3A to 9A are cross-sectional views taken along the line I-I' of FIG. 2 illustrating processing steps in the fabrication of integrated circuit devices according to some embodiments of the present invention.

FIGS. 3B to 9B are cross-sectional views taken along the line II-II' of FIG. 2 illustrating processing steps in the fabrication of integrated circuit devices according to some embodiments of the present invention.

DETAILED DESCRIPTION OF EMBODIMENTS OF THE PRESENT INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. The term "directly on" means that there are no intervening elements. It will be further understood that the term "in" may include both a layer, region or substrate in another layer, region or substrate or a layer, region or substrate on another layer region or substrate. It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
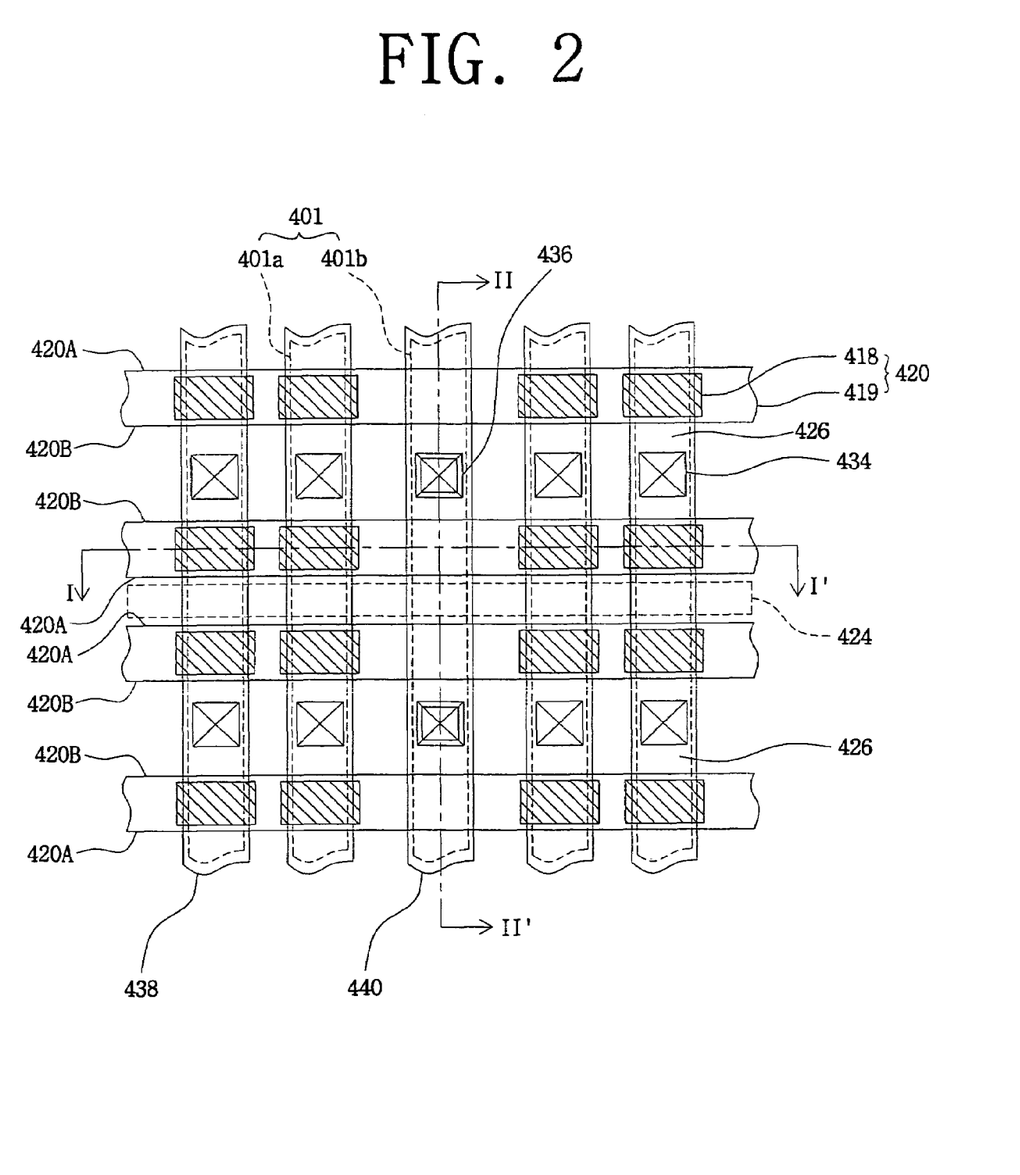
FIG. 2 is a plan view illustrating NOR-type flash memory devices according to some embodiments of the present invention.

FIG. 2 is a plan view illustrating NOR-type flash memory devices according to some embodiments of the present invention. FIGS. 3A to 9A are cross-sectional views taken along the line I-I' of FIG. 2 illustrating processing steps in the fabrication of NOR-type flash memory devices according to some embodiments of the present invention. FIGS. 3B through 9B are cross-sectional views taken along the line II-II' of FIG. 2 illustrating processing steps in the fabrication of NOR-type flash memory devices according to some embodiments of the present invention.

Figure 3A:
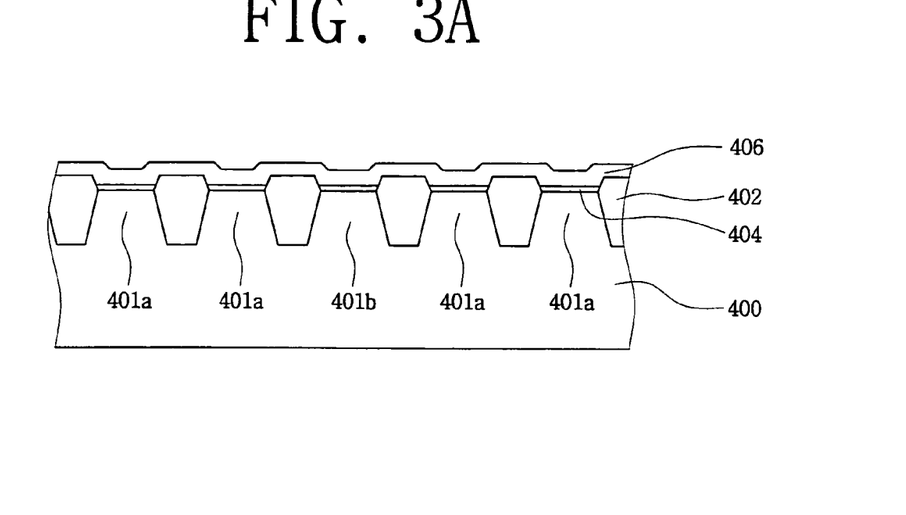
Figure 3B:
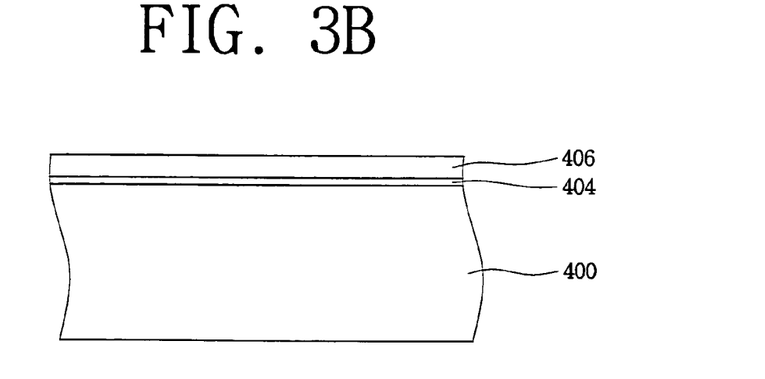

Referring now to FIGS. 2, 3A and 3B, a device isolation layer 402 is formed in the integrated circuit substrate 400. The device isolation layer 402 defines a plurality of parallel active regions 401, for example, cell active regions 401*a* and at least one source active region 401*b* between the cell active regions 401a. The device isolation layer 402 may be formed by, for example, a shallow trench isolation (STI) process. A tunnel oxide layer 404 is formed on the active regions 401. In some embodiments of the present invention, the tunnel oxide layer 404 may be, for example, a thermal oxide layer. A first conductive layer 406 is formed on the integrated circuit substrate including the tunnel oxide layer 404. In certain embodiments of the present invention, the first conductive layer 406 may be, for example, a polysilicon layer.

Figure 4A:
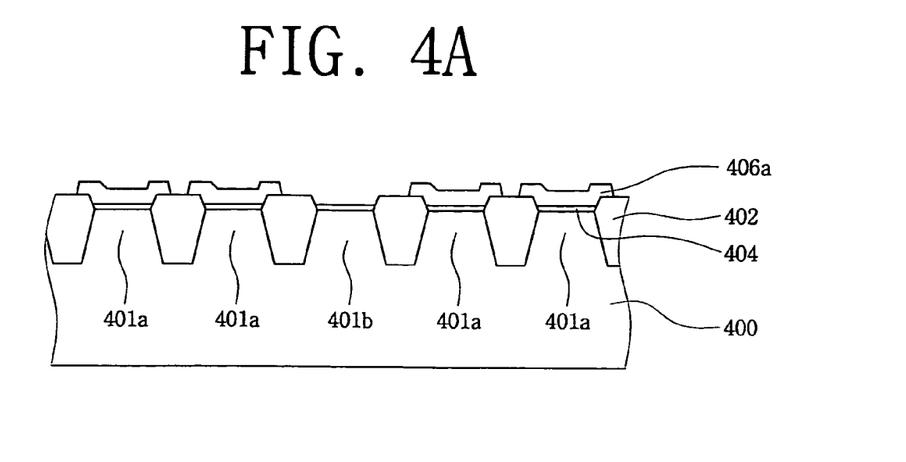
Figure 4B:
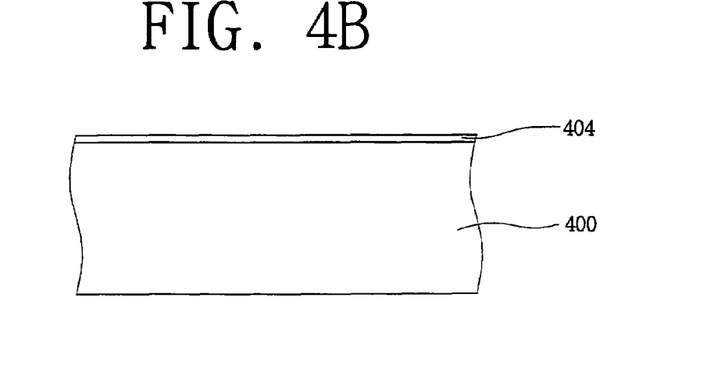

Referring now to FIGS. 2, 4A and 4B, the first conductive layer 406 is patterned to form floating gate patterns 406a on the integrated circuit substrate 400. The first conductive layer 406 may be patterned using, for example, a photolithography/anisotropic etching process. The floating gate patterns 406a are provided on the cell active regions 401a and as illustrated in FIG. 4A, the first conductive layer 406 is etched on the source active region 401b to expose the source active region 401b. That is, the floating gate patterns 406a cover the cell active regions 110a and have line shapes.

Figure 5A:
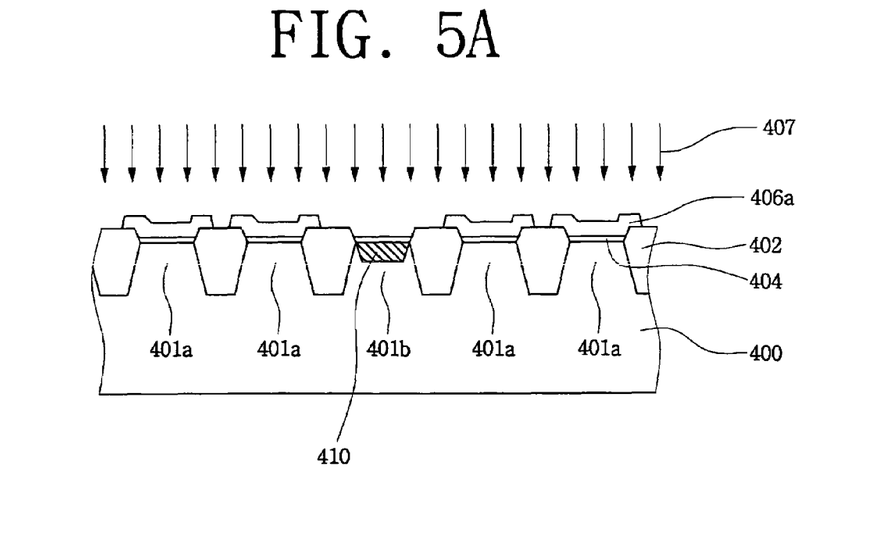
Figure 5B:
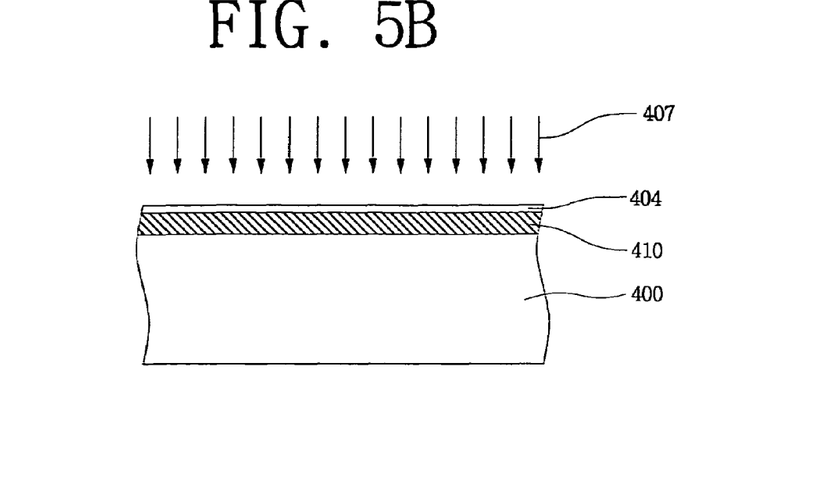

Referring now to FIGS. 2, 5A and 5B, impurity ions 407 are implanted into the integrated circuit substrate using the device isolation layer 402 and the floating gate patterns 406a as ion implantation masks to form a buried difflusion layer 410 in the source active region 401b. At the same time, the impurity ions 407 are implanted into the floating gate patterns 406a on the cell active regions 401a, which may improve conductivity of the floating gate patterns 406a. The impurity ions 407 implanted into the source active region 401b during the above-mentioned procedure may be the same type of impurity ions as those implanted to form source and drain regions in a process discussed further below.

Figure 6A:
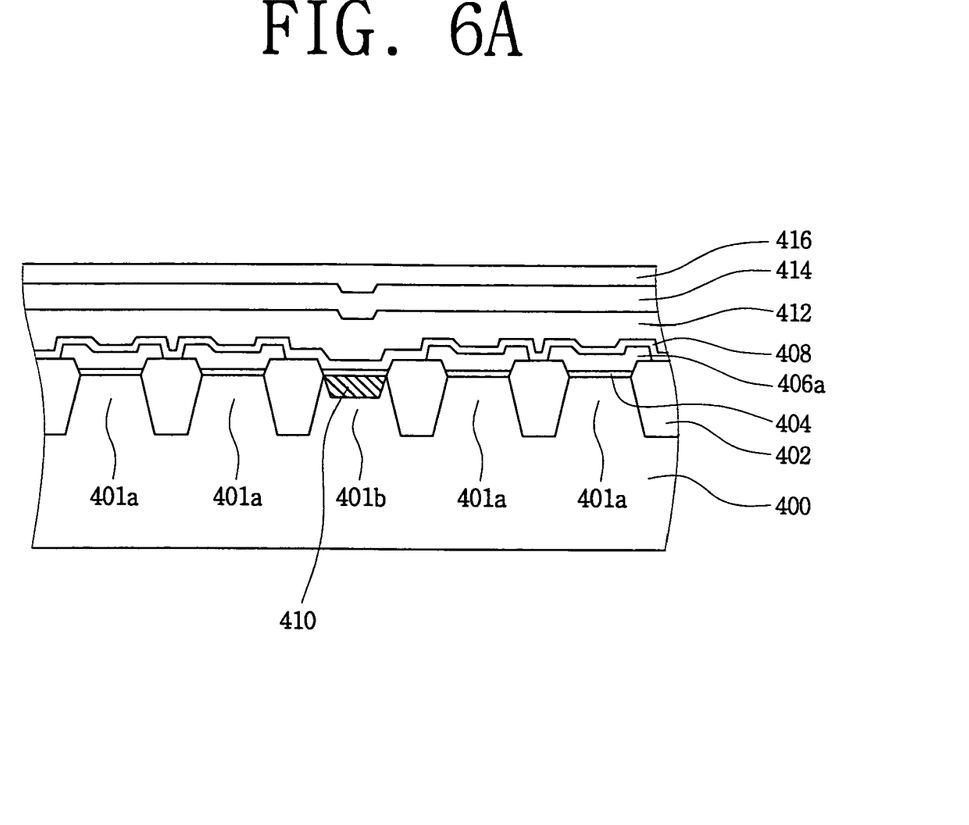
Figure 6B:
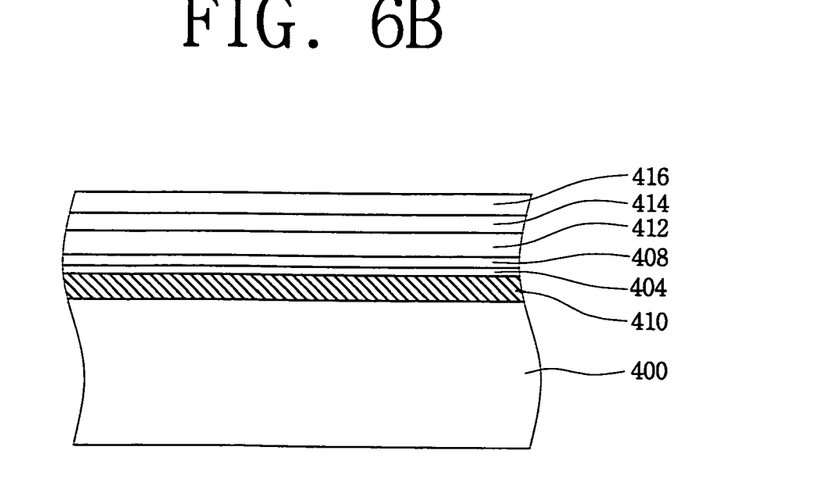

Referring now to FIGS. 2, 6A and 6B, an inter-gate dielectric layer 408, a second conductive layer 412, a third conductive layer 414 and a capping layer 416 are sequentially formed on the surface of the integrated circuit substrate including the buried diffusion layer 410. The inter-gate dielectric layer 408 may be, for example, an oxide-nitride-oxide (ONO) layer, and the second conductive layer 412 may be, for example, a polysilicon layer. The third conductive layer 414 may be, for example, a metal silicide layer, such as a tungsten silicide layer. In some embodiments of the present invention, the capping layer 416 may be, for example, a silicon oxide layer or a silicon nitride layer.

Figure 7A:
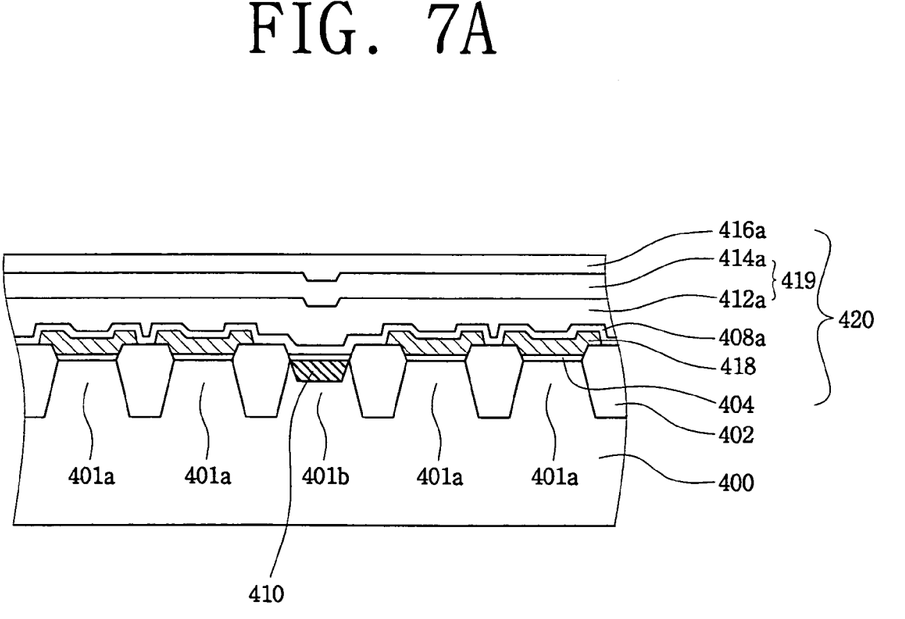
Figure 7B:
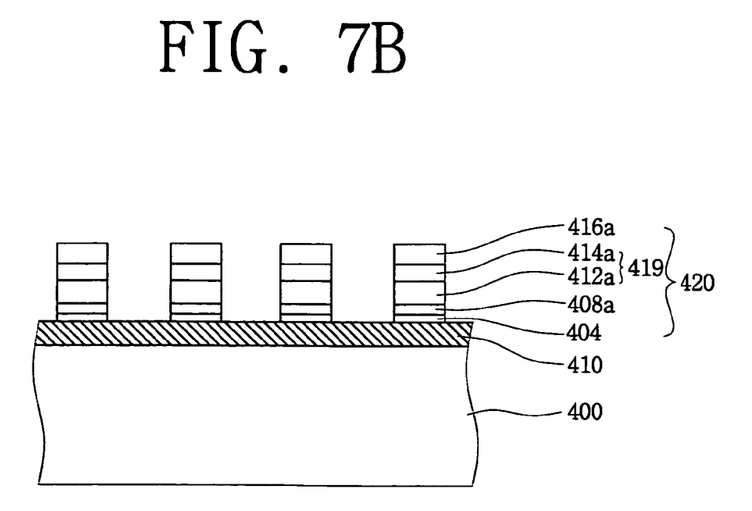

As illustrated in FIGS. 2, 7A and 7B, the capping layer 416, the third conductive layer 414, the second conductive layer 412, the inter-gate dielectric layer 408 and the floating gate patterns 406a are patterned to form a plurality of parallel word line patterns 420 crossing over the active regions 401. Each of the word line patterns forms a substantially straight line pattern. The word line patterns 420 are formed such that a first sidewall 420A of the word line patterns 420 is parallel to a second sidewall 420B of the word lines patterns 420 as illustrated in FIG. 2. As illustrated in FIGS. 7A and 7B, the word line patterns 420 include a tunnel oxide layer 404, a floating gate 418, an inter-gate dielectric layer pattern 408a, a control gate 419 and a capping layer pattern 416a, which are sequentially stacked. In some embodiments of the present invention, the control gate 419 may include a second conductive layer pattern 412a and a third conductive layer pattern 414a, which are sequentially stacked. The tunnel oxide layer 404 between the word line patterns 420 may be removed by over-etching during formation of the word line patterns 420.

Furthermore, the first conductive layer 406 on the source active region 401b is etched during formation of the floating gate patterns 406a. Thus, each of the word line patterns 420 on the source active region 401b has a tunnel oxide layer 404, an inter-gate dielectric layer pattern 408a, a control gate 419 and a capping layer pattern 416a, which are sequentially stacked as illustrated in FIG. 7B. In other words, the word line patterns 420 on the source active region 401b are free of a floating gate 418.

Figure 8A:
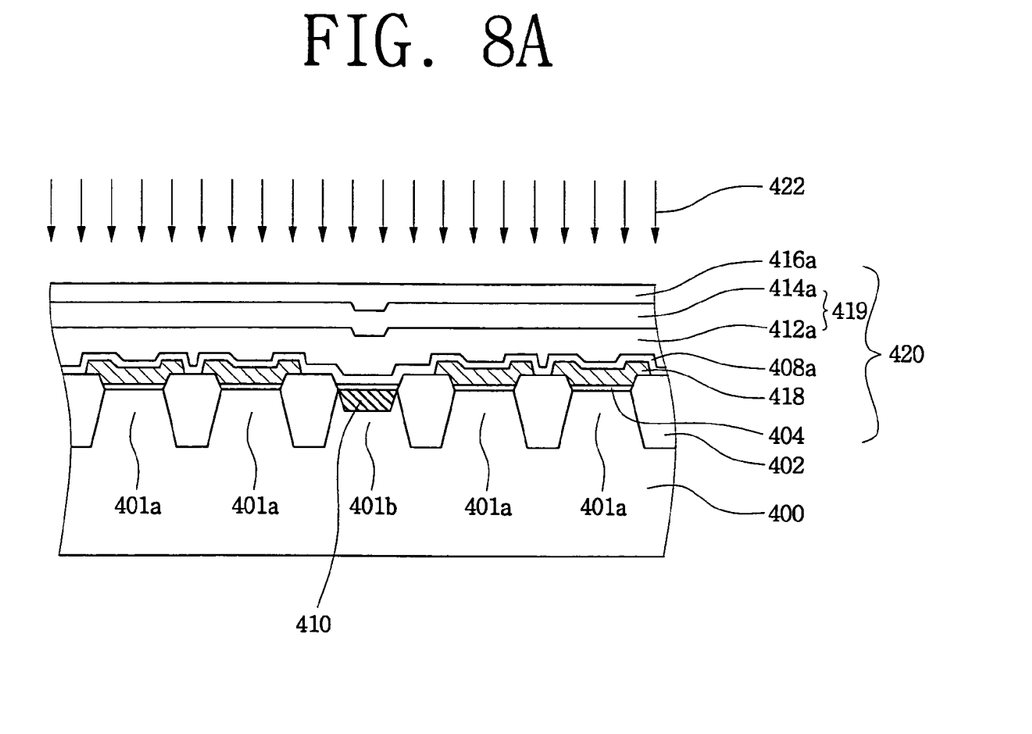
Figure 8B:
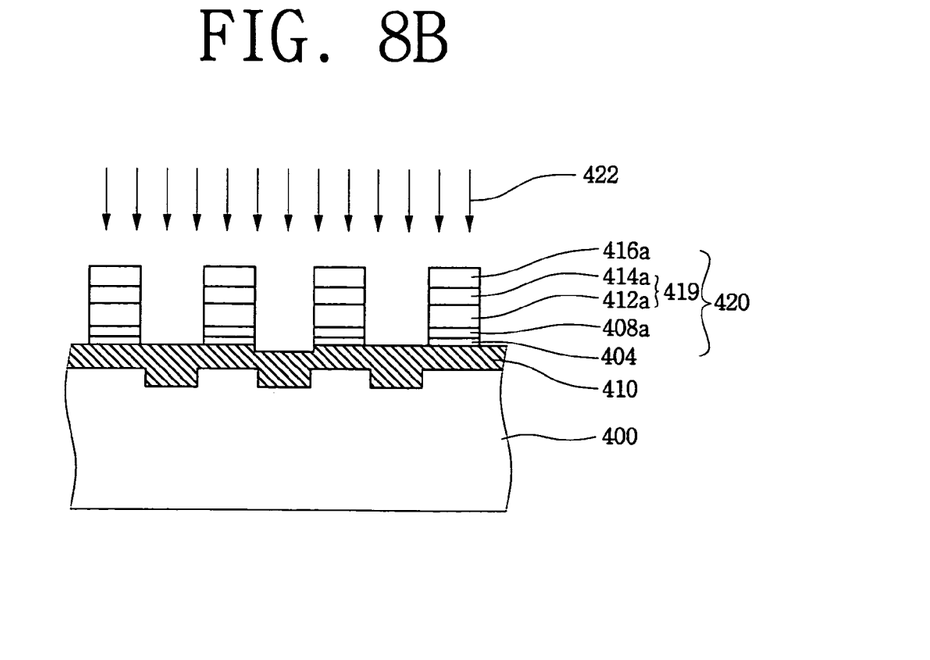

Referring to now to FIGS. 2, 8A and 8B, sources and drains are formed in the cell active regions 401a adjacent to first and second sidewalls 420A and 420B of the word line patterns 420, respectively. The sources may be included, for example, a self-aligned common source line 424 along a sidewall of the word line patterns 420, which may increase the degree of cell integration. In particular, after forming the word line patterns 420, a photoresist pattern (not shown) may be formed to expose the active regions 401 and the device isolation layer 402, which are exposed along the first sidewalls 420A of the word line patterns 420. In this case, the device isolation layer 402 and the active regions 401, which are exposed along the second sidewalls 420B of the word line patterns 420, are covered by the photoresist pattern. The active regions 401 and the device isolation layer 402, which are exposed along the both sidewalls 420A and 420B, may be exposed by, for example, an anisotropic etching process used to form the word line patterns 402. The device isolation layer 402 may be anisotropically etched using the photoresist pattern as an etch mask to form a common source line region along the first sidewalls 420A of the word line patterns 402. The anisotropic etching process may be performed to have an etch selectivity with respect to the device isolation layer 402. For example, if the device isolation layer 402 is a silicon oxide layer, the anisotropic etching process may be performed to have etch selectivity with respect to the silicon oxide layer. The active regions 401 exposed by the photoresist pattern may be slightly etched during etching of the device isolation layer 402. Thus, a surface of the source active region 401b may have a step difference with the common source line region as illustrated in FIG. 8B.

Impurity ions 422 are implanted into the integrated circuit substrate 400 using the word line patterns 420 as an ion implantation mask after the photoresist pattern is removed. The common source line 424, a diffusion region of the impurity ions 422, is formed in the integrated circuit substrate 400 of the common source line region. Simultaneously, drains 426 (FIG. 2) are formed in the cell active regions 401a adjacent to the second sidewalls 420B of the word line patterns. As mentioned above, in some embodiments of the present invention, the impurity ions 422 implanted into the exposed cell active regions 401a and the common source line region may be the same type of impurity ions implanted into the source active region 401b during formation of the buried diffusion layer 410. For example, if the buried diffusion layer 410 is a diffusion region of n-type impurity ions, the common source line 424 and the drain regions 426 may also be formed of a diffusion region of n-type impurity ions.

If the tunnel oxide layer 404 formed on the active regions 401 is over-etched during formation of the word line patterns 420 as mentioned above, the impurity ions 422 to be implanted to form the common source line 424 and the drain regions 426, may be implanted into the integrated circuit substrate 400 deeper than those to be implanted into the source active region 401b to form the buried diffusion layer 410. As a result, a lower portion of the buried difflusion layer 410 in the source active region 401b may have an uneven profile as illustrated in FIG. 8B.

Figure 9A:
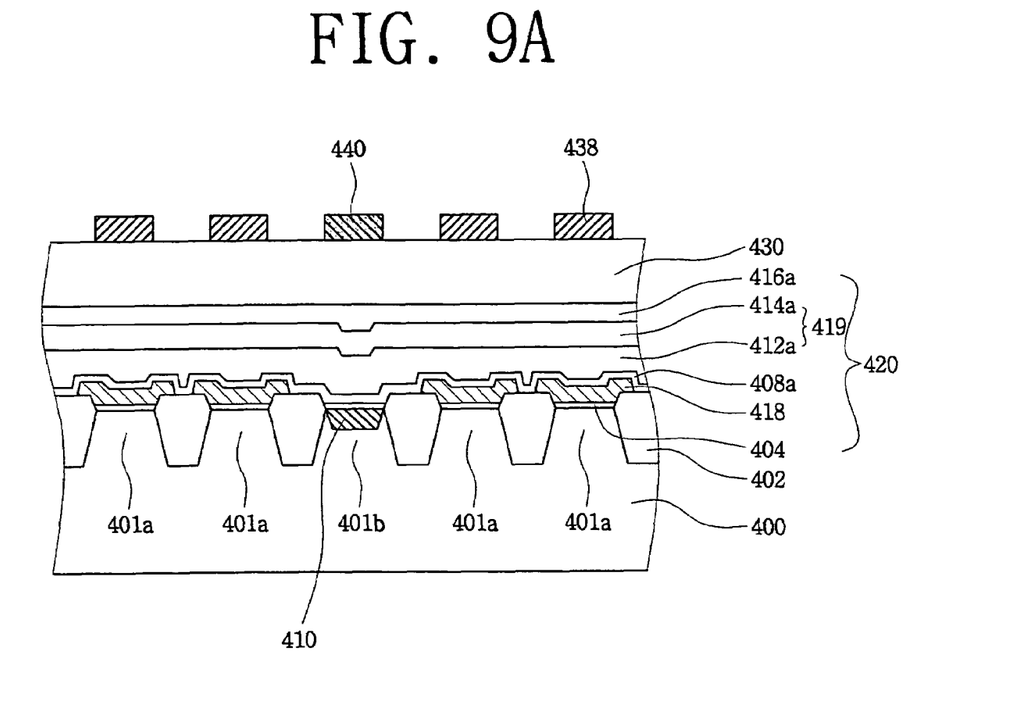
Figure 9B:
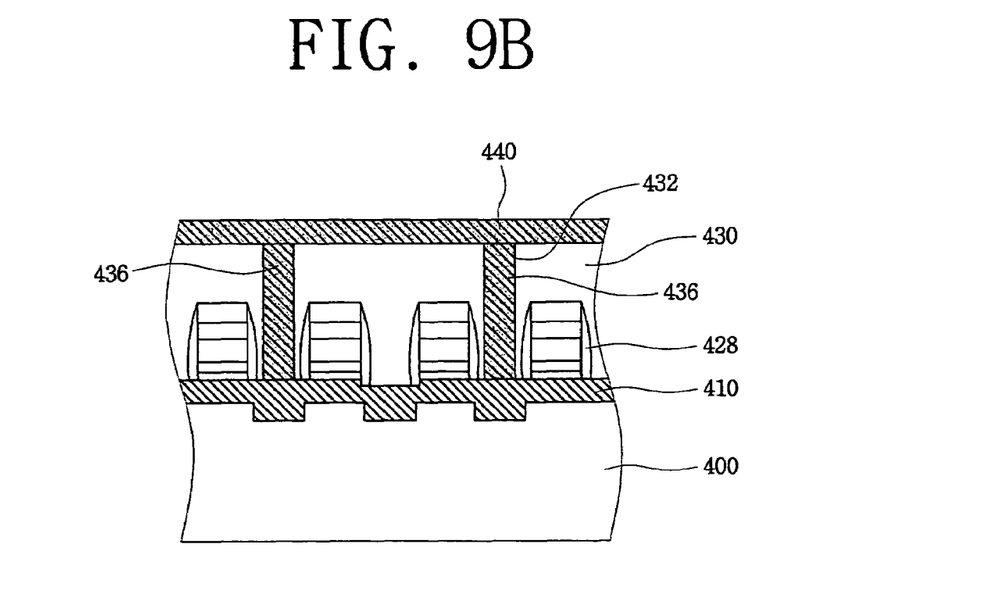

Referring now to FIGS. 2, 9A and 9B, an interlayer insulating layer 430 is formed on the surface of the integrated circuit substrate 400. The upper surface of the interlayer insulating layer 430 may be planarized by, for example, a chemical mechanical polishing (CMP) process. In some embodiments of the present invention, before forming the interlayer insulating layer 430, a silicon nitride layer may be formed on the surface of the integrated circuit substrate 400 and an etchback process may be performed to form spacers 428 on the sidewalls of the word line patterns 420. The interlayer insulating layer 430 may be patterned to form bit line contact holes (not shown) exposing the drains 426 and to simultaneously form common source contact holes 432 exposing the source active region 401b. A conductive material, such as polysilicon, is deposited to fill the bit line contact holes and the common source contact holes 432, and is polished to form bit line contact plugs 434 (FIG. 2) and common source contact plugs 436 until the upper surface of the interlayer insulating layer 430 is exposed. The common source contact plugs 436 are electrically connected to the common source line 424 through the buried diffusion layer 410 formed in the source active region 401b. According to embodiments of the present invention, the common source contact plugs 436 are formed on the same line along the second sidewalls 420B of the word line patterns 420 with the bit line contact plugs 434 as illustrated in FIG. 2. In other words, the common source contact plugs 436 are formed to contact the buried diffusion layer 410 between drains disposed on the lines parallel with the word line patterns 420.

A conductive material, such as tungsten, is formed on the interlayer insulating layer 430 and patterned to form bit lines 438 that are electrically coupled to the upper surface of the bit line contact plugs 434, and a common source contact wiring 440 that is electrically coupled to the upper surface of the common source contact plugs 436. The bit lines 438 are formed on the interlayer insulating layer 430 over the cell active regions 401a in a direction crossing the word line patterns 420, and the common source contact wiring 440 is formed on the interlayer insulating layer 430 over the source active region 401b in parallel with the bit lines 438.

Referring now to FIGS. 2, 9A and 9B, flash memory devices according to some embodiments of the present invention will be discussed. As illustrated, the device isolation layer 402 is provided in the integrated circuit substrate 400. The device isolation layer 402 may define a plurality of active regions 401, for example, a plurality of parallel cell active regions 401a and at least one source active region 401b between the cell active regions 401a.

A buried diffusion layer 410 is provided in the source active region 401b. The buried diffusion layer 410 may be an impurity diffusion region of impurity ions. A plurality of word line patterns 420 having first and second parallel sidewalls 420A and 420B are provided to cross over the source active region 401b and the cell active regions 401a. On the cell active regions 401a, each of the word line patterns 420 includes a tunnel oxide layer 404, a floating gate 418, an inter-gate dielectric layer pattern 408a, a control gate 419 and a capping layer pattern 416a, which are sequentially stacked. Furthermore, on the source active region 401b, each of the word line patterns 420 includes the tunnel oxide layer 404, the inter-gate dielectric layer pattern 408a, the control gate 419 and the capping layer pattern 416a, which are sequentially stacked. The word line patterns 420 on the source active region 401b are free of a floating gate 418.

Sources are provided in the cell active regions 401a adjacent to the first sidewalls 420A of the word line patterns 420. These sources may be included in the common source line 424. Furthermore, drains 426 are provided in the cell active regions 401a adjacent to the second sidewalls 420B of the word line patterns 420. The drains 426 and the common source line 424 including the sources are impurity diffusion regions, which have the same type of impurity ions as the buried diffusion layer 410. For example, the common source line 424, the drains 426 and the buried diffusion layer 410 may be impurity diffusion regions of n-type impurity ions.

An interlayer insulating layer 430 is provided on a surface of the integrated circuit substrate 400 having the common source line 424 and the drains 426. Bit line contact holes (not shown) exposing the drains 426 through the interlayer insulating layer 430 are provided in the interlayer insulating layer 430. In addition, common source contact holes 432 exposing the buried diffusion layer 410 through the interlayer insulating layer 430 are provided in the interlayer insulating layer 430. Bit line contact plugs 434 are disposed to fill the bit line contact holes, and common source contact plugs 436 are disposed to fill the common source contact holes 432. The bit line contact plugs 434 and the common source contact plugs 436 may be a conductive material, such as polysilicon. The common source contact plugs 436 are provided to contact a portion of the buried diffusion layer 410 between the drains 426 disposed on the lines parallel with the word line patterns 420. In other words, the common source contact plugs 436 and the bit line contact plugs 434 are provided on the same line along the second sidewalls 420B of the word line patterns 420 Bit lines 438 electrically coupled to an upper surface of the bit line contact plugs 434, and common source contact wiring 440 electrically coupled to an upper surface of the common source contact plugs 436 are provided on the interlayer insulating layer 430. The bit lines 438 are provided over the cell active regions 401a in a direction crossing the word line patterns 420. The common source contact wiring 440 is provided over the source active region 401b in parallel with the bit lines 438.

As briefly discussed above with respect to FIGS. 2 through 9B, embodiments of the present invention provide word line patterns having substantially parallel sidewalls and, therefore, maintain straight lines around the common source contact hole in the integrated circuit memory device. As a result, the distribution of the erase threshold voltage of the flash memory device may possibly be improved. Furthermore, the frequency of the occurrence of an electrical short between bit line contact plugs and words line patterns adjacent to both sides of the bit line contact plugs may be reduced according to some embodiments of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A method of fabricating an integrated circuit device comprising:
   forming a buried diffusion layer in a source active region;
   forming a word line pattern crossing over parallel cell active regions and the source active region, the word line pattern having parallel sidewalls such that the word line pattern forms a substantially straight line pattern on an integrated circuit substrate; and
   forming a plurality of bit line contact plugs and at least one common source contact plug being electrically coupled to the buried diffusion layer in an insulating layer on the integrated circuit substrate, the bit line contact plugs and the common source contact plug being disposed in a line on the integrated circuit substrate that is substantially parallel to the word line pattern.

2. The method of claim 1, further comprising forming a common source line and drains in the integrated circuit substrate adjacent to a first sidewall of the word line pattern and in the cell active regions adjacent to a second sidewall of the word line pattern, respectively, wherein the drains are electrically coupled to the bit line contact plugs and the common source line is electrically coupled to the common source contact plug through the buried diffusion layer.

3. The method of claim 2, wherein the buried diffusion layer, the common source line and the drains comprise impurity diffusion regions having a same type of impurity ions.

4. The method of claim 3, wherein a distance between the plurality of the bit line contact plugs and the word line pattern is substantially the same.

5. The method of claim 3, wherein forming the buried diffusion layer is preceded by forming a plurality of floating gate patterns on the plurality of cell active regions and wherein the source active region is free of the floating gate patterns.

6. The method of claim 5, wherein forming the plurality of floating gate patterns comprises:
    forming a first conductive layer on the integrated circuit substrate; and
    patterning the first conductive layer to provide the plurality of floating gate patterns.

7. The method of claim 5, wherein forming the buried diffusion layer is preceded by forming a device isolation layer in the integrated circuit substrate, the device isolation layer defining the plurality of parallel cell active regions and the source active region.

8. The method of claim 7, wherein forming the buried diffusion layer comprises implanting impurity ions into the integrated circuit substrate using the device isolation layer and the floating gate patterns as ion implantation masks.

9. The method of claim 8, wherein the impurity ions comprise N-type impurity ions.

10. The method of claim 5, wherein forming the word line pattern comprises:
    forming an inter-gate dielectric layer on the integrated circuit substrate after forming the buried diffusion layer;
    forming a second conductive layer on the inter-gate dielectric layer;
    forming a third conductive layer on the second conductive layer;
    forming a capping layer on the third conductive layer; and
    patterning the capping layer, the third conductive layer, the second conductive layer, the inter-gate dielectric layer and the floating gate patterns to provide the word line pattern.

11. The method of claim 5, further comprising forming a common source contact wiring that is electrically coupled to upper surfaces of the common source contact plug.

12. The method of claim 1, wherein the integrated circuit device comprises a flash memory device.

* * * * *